United States Patent [19]
Klassen et al.

[11] Patent Number: 5,264,796
[45] Date of Patent: Nov. 23, 1993

[54] FAULT DETECTION AND ISOLATION IN AUTOMOTIVE WIRING HARNESS INCLUDING DEDOCATED TEST LINE

[75] Inventors: David J. Klassen, Dearborn; Edward G. Anderson, Bloomfield Hills, both of Mich.

[73] Assignee: Ford Motor Company, Dearborn, Mich.

[21] Appl. No.: 504,502

[22] Filed: Apr. 3, 1990

[51] Int. Cl.⁵ .............................. G01R 31/02
[52] U.S. Cl. .................... 324/503; 324/527; 324/532; 324/538
[58] Field of Search ........... 324/503, 527, 532, 533, 324/534, 535, 538, 539, 541, 542, 529

[56] References Cited

U.S. PATENT DOCUMENTS

| | | | |
|---|---|---|---|
| 3,244,975 | 4/1966 | Bauer | 324/533 |
| 3,609,535 | 9/1971 | Paine et al. | 324/52 |
| 3,699,438 | 10/1972 | Webb | 324/66 |
| 3,718,859 | 2/1973 | Arlow | 324/72.5 |
| 3,728,616 | 4/1973 | Cheek et al. | 324/51 |
| 3,750,012 | 7/1973 | Fellers et al. | 324/527 X |
| 3,781,665 | 12/1973 | Gale | 324/533 |
| 4,042,832 | 8/1977 | Cassarino, Jr. et al. | 307/149 |
| 4,218,745 | 8/1980 | Perkins | 364/489 |
| 4,257,002 | 3/1981 | Helms et al. | 324/66 |
| 4,271,388 | 6/1981 | Schaling | 324/51 |
| 4,322,677 | 3/1982 | Wright | 324/52 |
| 4,399,400 | 8/1983 | Rockwell et al. | 324/51 |
| 4,527,113 | 7/1985 | Hillerich | 324/533 |
| 4,689,551 | 8/1987 | Ryan et al. | 324/51 |
| 4,812,752 | 3/1989 | Preuss | 324/542 |
| 4,843,327 | 6/1989 | Koppitsch et al. | 324/525 |
| 4,859,953 | 8/1989 | Young et al. | 324/539 |
| 4,884,034 | 11/1989 | Guzman | 324/529 |
| 4,949,076 | 8/1990 | Wann | 324/533 X |
| 4,998,069 | 3/1991 | Nguyen et al. | 324/539 |
| 5,034,727 | 7/1991 | Muraoka | 340/652 |
| 5,066,919 | 11/1991 | Klassen et al. | 324/538 |

FOREIGN PATENT DOCUMENTS 0164570 7/1985 European Pat. Off. .

Primary Examiner—Kenneth A. Wieder
Assistant Examiner—Glenn W. Brown
Attorney, Agent, or Firm—Mark Mollon; Roger L. May

[57] ABSTRACT

An automotive electrical system including a wiring harness incorporates a dedicated test line passing through critical connectors and components for allowing detection and isolation of improperly connected connectors. The dedicated test line can feed through expansion connectors, termination connectors, and junction blocks. Connector fault detection and isolation can be performed as a test after final assembly and during vehicle servicing. A large number of expensive and inconvenient vehicle quits and tow-in's are avoided that would otherwise occur.

19 Claims, 4 Drawing Sheets

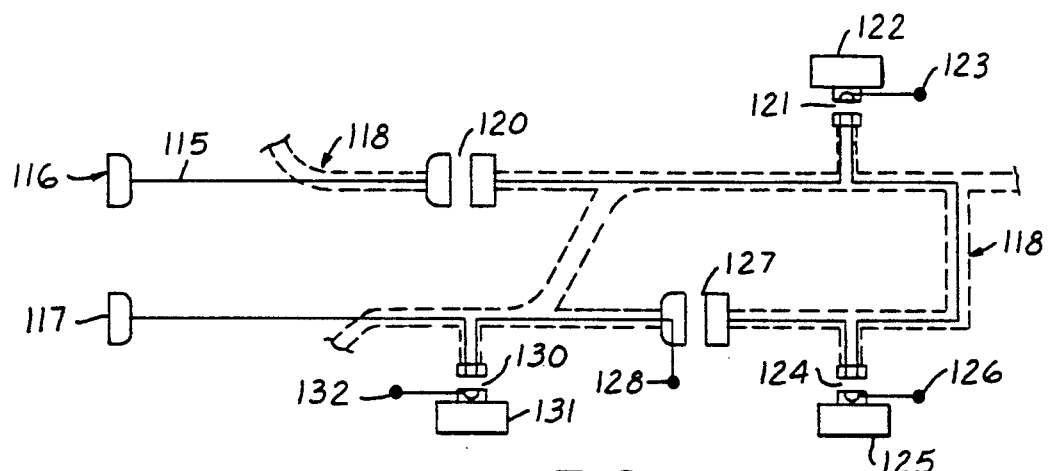
FIG.7
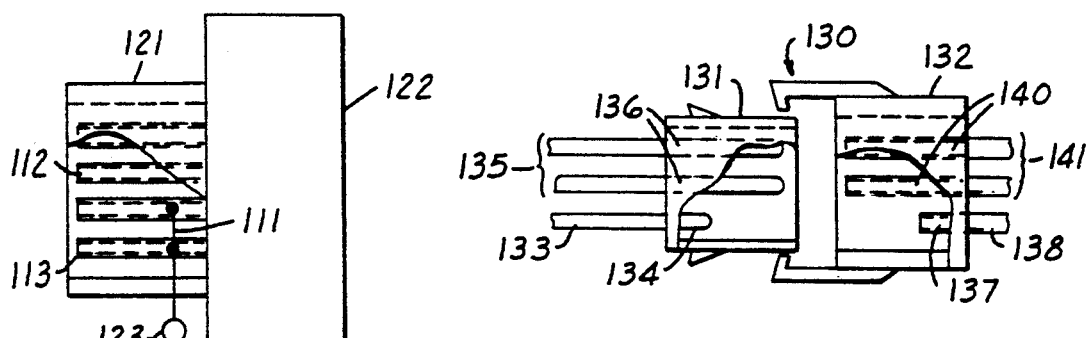
FIG.8
FIG.9
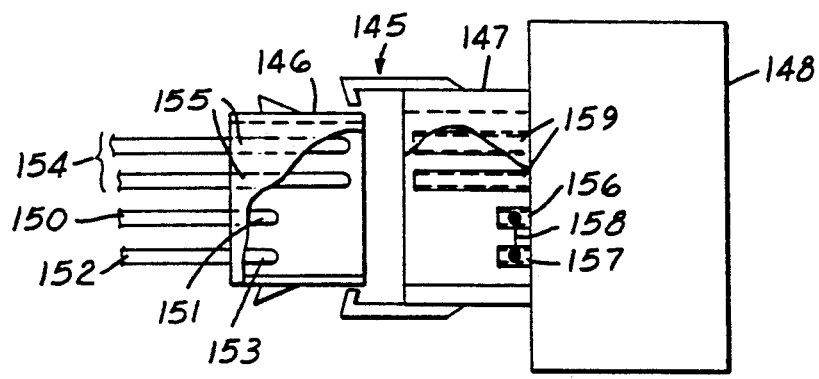
FIG.10

FAULT DETECTION AND ISOLATION IN AUTOMOTIVE WIRING HARNESS INCLUDING DEDOCATED TEST LINE

CROSS-REFERENCE TO RELATED APPLICATIONS

This application is related to copending and commonly assigned U.S. application Ser. No. 07/504,458, now U.S. Pat. No. 5,066,919, and U.S. application Ser. No. 07/504,451, both filed on the same date as this application.

BACKGROUND OF THE INVENTION

The present invention relates in general to the detection and isolation of interconnect faults in an automotive wiring system, and more specifically to a dedicated test line included in the wiring harness to determine the existence and/or location of improperly connected connectors.

The electrical interconnect system of an automobile takes the form of a wiring harness which is normally partitioned into segments. Each segment includes a number of individual conductors. Individual segments are joined by electrical connectors at either end. Furthermore, an individual conductor or conductors may leave the main bundle of wires in a particular segment to form a subsegment which extends to another connector. The shape of the wiring system is irregular and cannot normally be classified as a star, ring or other regular configuration.

Because of the segmented structure of a wiring harness, point-to-point connections between the electrical system load devices interconnected in the wiring system normally include many connectors and conductor segments. These connectors include expansion connectors, termination connectors, and junction blocks. An expansion connector interconnects the partitioned segments of the wiring harness, i.e., expands the wiring harness. Termination connectors interconnect the electrical devices of the vehicle with the wiring harness system, i.e., at terminations of the wiring harness segments. Thus, the electrical devices are referred to as termination devices. A junction block is a device for cross-connecting wiring harness segments, electrical system devices, individual wiring harness conductor wires, and other junction blocks. The conductors of the wiring harness system and the connectors can be either electrical, optical, or both.

Improperly connected or nonconnected connectors result in the partial or complete failure of an electrical device or devices connected to the electrical system. Failure of a critical electrical system component may cause the vehicle to quit (i.e., lose drivability) which often requires the vehicle to be towed in for service. Interconnect problems that may inadvertently be present include both complete failures to properly interconnect connectors and partial interconnect failures such as when connectors are not fully inserted to their snap-lock position. These interconnect problems may not become apparent until extended use of the electrical system causes damage to an improperly connected device or until vibrations cause a partially connected connector to separate.

In order to maximize vehicle reliability and to minimize warranty and repair costs, it is desirable to reduce interconnect faults by detecting and isolating their occurrence. A simple and inexpensive system is needed which is adaptable to testing after final assembly, testing during service, and monitoring and fault prediction during vehicle use. Prior art wiring harness testing apparatus are complex and are not readily adaptable to testing under all circumstances.

U.S. Pat. No. 4,689,551, issued to Ryan et al, discloses a wiring harness testing apparatus which tests for proper assembly of the wiring harness itself, i.e., before the prefabricated harness is installed into a vehicle and before the termination connectors of the harness are connected to the vehicle electrical components. The termination connectors of the harness must be plugged into the testing apparatus or to a special adaptor for testing. Each wire in the harness being tested is connected at one end to a current source and at the other end to ground by switches in the testing apparatus that are connected to each wire. Since the testing apparatus must be connected to the termination connectors of the wiring harness, the tests are not possible after the wiring harness is connected into the vehicle electrical system.

European patent application 164570, in the name of Goto et al, discloses a wiring harness checker wherein a checker connects to each termination connector of the wiring harness being tested. The checker is connected to the harness on a test table and checks the conduction of individual conductors in the harness in both or either direction. Thus, the checker is useful only for testing before final assembly since there is no ability to check the harness after it is connected to the electrical components in the vehicle.

U.S. Pat. No. 4,271,388, issued to Schaling, discloses another testing apparatus requiring direct connection of the tester to the conductors and connectors of the cable set being tested. Shift registers are connected to one end of each conductor or connector to be tested. Light emitting diodes and logic circuits connected to the other end of each conductor or connector monitors signals received from the shift registers and indicate the correct or incorrect assembly of the wiring harness itself. Thus, the tester is suitable for testing only before final assembly with the electrical system components of the vehicle.

U.S. Pat. No. 3,718,859, issued to Arlow, discloses a test element in the form of a connector insert which allows monitoring of individual conductors while a wiring harness is interconnected and in operation. The test element plugs into and interconnects the pins of a pair of connectors. The test element includes terminals on its outer surface, each terminal being electrically connected to one of the connector pins and thus to one of the individual conductors of the wiring harness. The terminals may be contacted by a meter to monitor a signal on the corresponding individual conductor. Therefore, the individual conductor can only be tested when the corresponding electrical device is energized. Furthermore, the failure to monitor an expected signal from a conductor does not reveal the location or reason for the occurrence of the fault.

These are some of the deficiencies which the present invention overcomes.

SUMMARY OF THE INVENTION

It is an object of the present invention to provide a method and apparatus for detecting an interconnection fault of an automotive electrical system including a wiring harness after final assembly of the harness with the electrical system devices.

It is another object of the invention to provide uncomplicated and reliable means for testing the interconnection of a wiring harness system including connections between the termination connectors of the wiring harness and the electrical components of the vehicle electrical system.

It is a further object of the invention to provide a method and apparatus for isolating the location of detected faults.

It is still another object of the invention to provide an automotive electrical system which can conveniently be tested after final assembly, during later servicing of the vehicle, and even during vehicle use.

These and other objects are achieved according to the present invention by modifying the automobile electrical system to include a dedicated test line in at least a portion of the electrical system. The dedicated test line includes additional conductors in the wiring harness and dedicated and modified connector components. By examining terminal characteristics of the dedicated test line after final assembly of the electrical system, faults in the interconnection of harness expansion connectors and termination connectors are detected and their location isolated. Thus, the dedicated test line includes one or more test points for examining the electrical characteristics of the test line. The dedicated test line includes a termination conductor within a termination connector, such that the termination conductor is included in the dedicated test line only when the device connected by the termination connector is properly interconnected with the electrical system.

BRIEF DESCRIPTION OF THE DRAWINGS

The novel features of the invention are set forth with particularity in the appended claims. The invention itself, however, both as to its organization and method of operation, together with further objects and advantages thereof, may best be understood by reference to the following description taken in conjunction with the accompanying drawings, in which:

FIG. 7 is a diagram showing an alternative embodiment of the present invention wherein test contacts are provided at a plurality of the connectors.

FIG. 8 is a cross-sectional view of a termination connector including a test contact according to the embodiment of FIG. 7.

FIG. 9 is a cross-sectional view of an expansion connector including last-make first-break terminals for the dedicated test line.

FIG. 10 is a cross-sectional view of a termination connector including last-make first-break terminals for the dedicated test line.

DETAILED DESCRIPTION OF PREFERRED EMBODIMENTS

Figure 1:
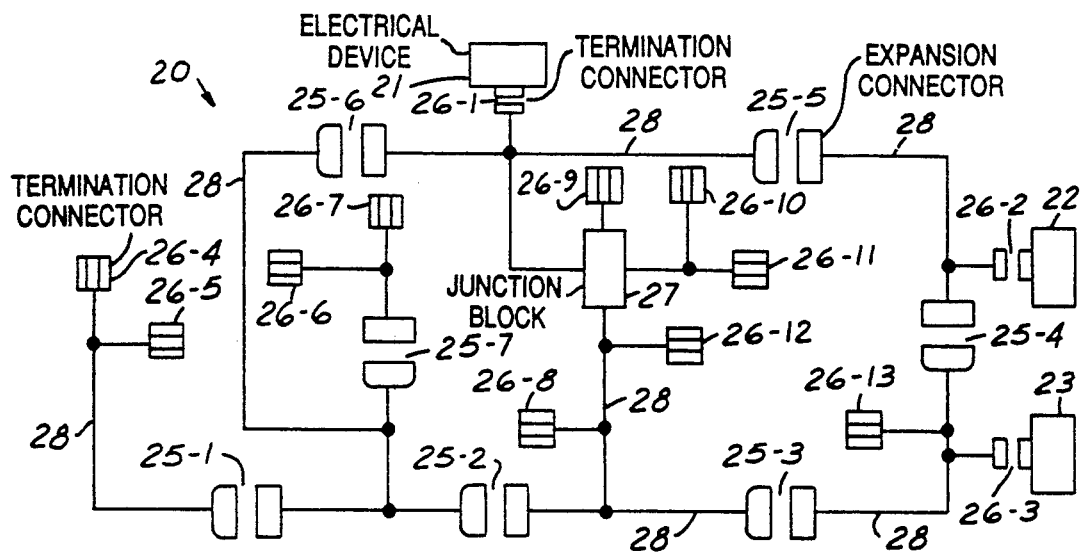
FIG. 1 is a diagram representing a portion of an automotive electrical system including a wiring harness system and termination devices.

FIG. 1 represents an automotive electrical system 20 including electrical system loads or supplies 21, 22, and 23, generally illustrative of various electrical components such as a radio, vehicle lighting, electric motors, or a voltage regulator. Since devices 21-23 are connected to the vehicle wiring harness through respective termination connectors 26-1, 26-2, and 26-3, each device is referred to as a termination device.

A wiring harness interconnects devices 21-23 and other devices (not shown for clarity of the drawing). The wiring harness includes a plurality of harness segments each comprised of a wire bundle, some of which are indicated at 28. Segments 28 are interconnected using expansion connectors 25. Termination connectors 26 interconnect the wiring harness with the termination devices of the electrical system. For example, a termination connector 26-1 interconnects termination device 21 with the wiring harness.

The wiring harness further includes a junction block 27 which connects through expansion connectors to harness segments 28 and which connects directly to some termination devices as shown. Segments 28 are shown as single lines although each contain a plurality of individual wires, some of which may leave the wire bundle at the several junction points.

Figure 2:
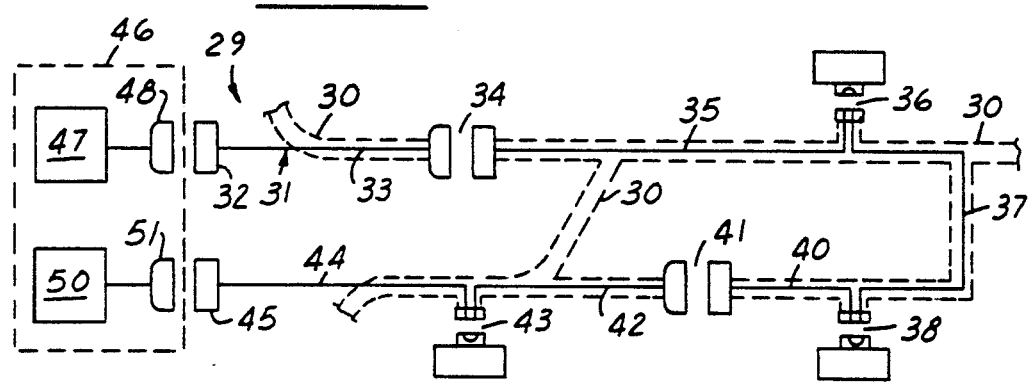
FIG. 2 is a diagram representing a portion of an automotive electrical system having a dedicated test line incorporated therein.

FIG. 2 represents a portion of an automotive electrical system 29 including a wiring harness 30 and a dedicated test line 31 according to the present invention. Dedicated test line 31 includes a first test point 32 connected to a first harness conductor 33 which enters wiring harness 30 and interconnects with an expansion connector 34. Dedicated test line 31 has corresponding connection pins mating in expansion connector 34 and continues with harness conductor 35. A termination connector 36 receives conductor 35 and provides a feed-through of the dedicated test line 31 to a harness conductor 37 when the termination device at termination connector 36 is properly interconnected. Harness conductor 37 feeds through another termination connector 38 only when its termination device is correctly interconnected. Dedicated test line 31 continues in a similar manner through a harness conductor 40, an expansion connector 41, a harness conductor 42, and a termination connector 43. After feeding through termination connector 43, dedicated test line 31 includes a harness conductor 44 extending to a second test point 45. Thus, there is a continuous electrical path from test point 32 to test point 45 only when each connector having dedicated test line 31 passing therethrough is properly interconnected.

FIG. 2 further includes test apparatus 46 for monitoring an electrical characteristic of dedicated test line 31. For example, a signal source 47 is interconnected with first test point 32 through a connector or probe 48. A signal indicator 50 is connected to second test point 45 through a connector or probe 51. Signal source 47 can be a DC voltage supply. Thus, test apparatus 46 facilitates determination of electrical continuity between test point 32 and test point 45. The failure of indicator 50 to show that a signal is received in response to the application of a signal by source 47 results in detection of an interconnection fault in the portion of wiring harness 30 containing dedicated test line 31. Preferably, the portion of wiring harness 30 which includes dedicated test line 31 corresponds to the portions of the electrical system which are considered critical to operation of the vehicle and failure of which would cause the vehicle to quit or operate in an unacceptable manner.

Figure 3:
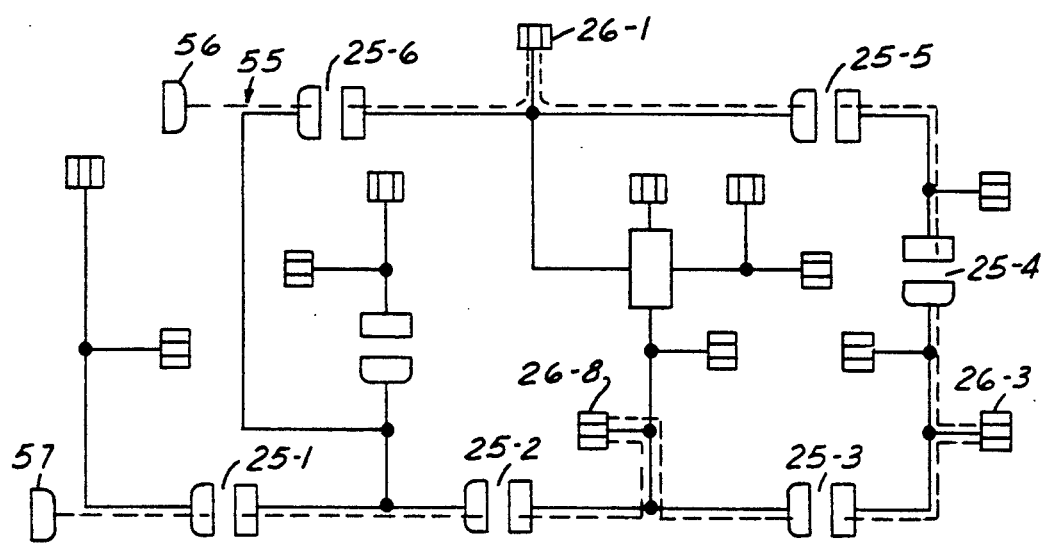
FIG. 3 is a diagram showing the addition of a dedicated test line to the electrical system shown in FIG. 1.

FIG. 3 illustrates the inclusion of a dedicated test line 55 into the electrical system of FIG. 1. Thus, dedicated test line 55 may extend from a first test point 56 and through critical electrical system components, including expansion connector 25-6, termination connector 26-1, expansion connector 25-5, expansion connector 25-4, termination connector 26-3, expansion connector 25-3, termination connector 26-8, expansion connector 25-2, and expansion connector 25-1, to a second test point 57.

Figure 4:
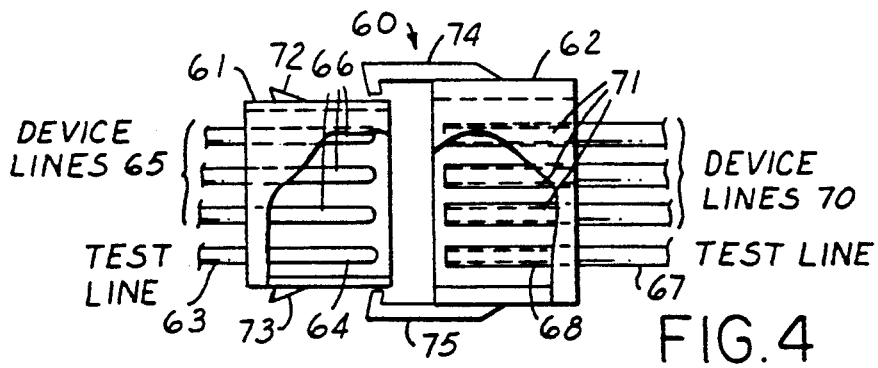
FIG. 4 is a cross-sectional view of an expansion connector containing a dedicated test line according to the present invention.

FIG. 4 shows one embodiment of a pin and socket expansion connector useful in the present invention. An expansion connector 60 includes a first end 61 and a second end 62. First end 61 receives a test line harness conductor 63 which is connected to a terminal pin 64. Standard device lines 65 of the wiring harness are connected to terminal pins 66. Second end 62 is connected to a test line harness conductor 67 which is joined to a terminal socket 68. Device lines 70 are connected to terminal sockets 71. Insertion of expansion connector ends 61 and 62 results in interconnection of the corresponding pins and sockets. On full insertion, expansion connector ends 61 and 62 are interlocked by means of projections 72 and 73 on first end 61 being received by locking tabs 74 and 75 on second end 62.

Figure 5:
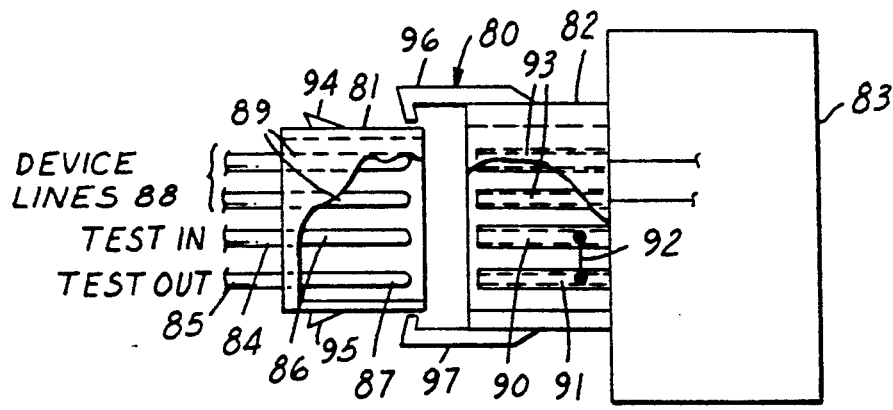
FIG. 5 is a cross-sectional view of a termination connector containing a dedicated test line according to the present invention.

FIG. 5 shows a termination connector according to one embodiment of the present invention. A pin and socket termination connector 80 includes a first end 81 at the harness end of the connector and a second end 82 which is at the device end of the connector and which is integral with a termination device 83. A harness conductor 84 provides a dedicated test line into termination connector 80 and is connected to a terminal pin 86. A harness conductor 85 provides a dedicated test line out of termination connector 80 and is connected to a terminal pin 87. Device lines 88 from the wiring harness are connected to terminal pins 89.

A terminal socket 90 and a terminal socket 91 in second connector end 82 are joined by a termination conductor 92 for feeding through the dedicated test line between harness conductors 84 and 85 when termination conductor 80 is properly interconnected. Upon full insertion of the harness end and the device end of termination connector 80, the connector is locked by means of projections 94 and 95 on first connector end 81 and locking tabs 96 and 97 on second connector end 82.

Figure 6:
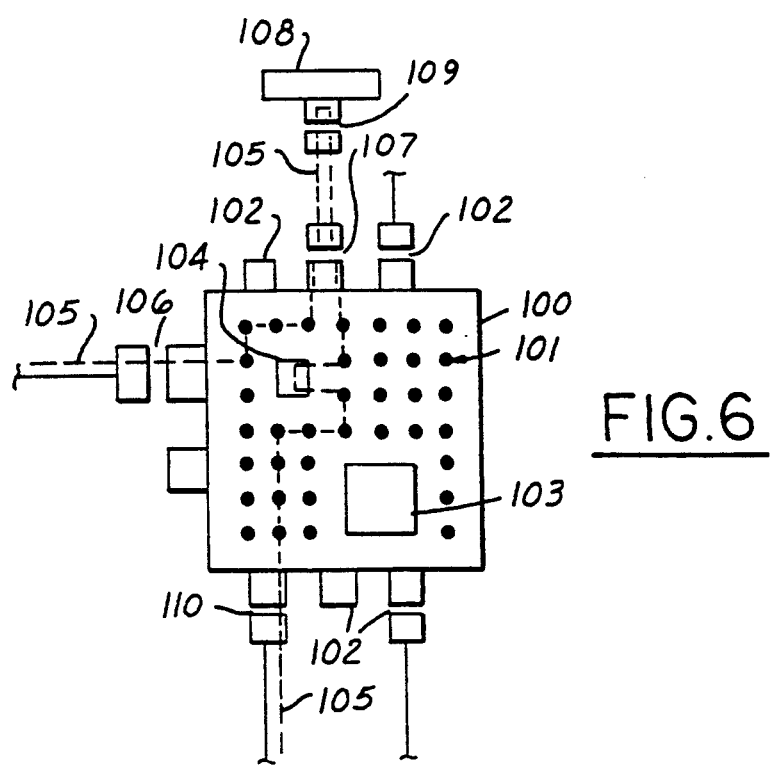
FIG. 6 is a plan view of a junction block containing a dedicated test line according to the present invention.

FIG. 6 shows a junction block 100 which may be included in the electrical system of the present invention. Junction block 100 is comprised of an integral molded block including conductors and interconnection points 101. Junction block 100 also includes a plurality of expansion connectors 102. Likewise, termination devices 103 and 104 are connected directly to junction block 100.

Junction block 100 further includes a dedicated test line 105 passing therethrough. Dedicated test line 105 is included in expansion connector 106 and passes into junction block 100. By means of a conductor integral with junction block 100, dedicated test line 105 passes into an expansion connector 107 and through termination connector 109 including a termination device 108. Dedicated test line 105 reenters junction block 100 through expansion connector 107 and passes through termination device 104 before exiting junction block 100 through an expansion connector 110.

A further embodiment of the fault detection and isolation system of the present invention is shown in FIG. 7. A dedicated test line 115 extends between a first test point 116 and a second test point 117. From test point 116, dedicated test line 115 enters a wiring harness 118 and passes through an expansion connector 120. Dedicated test line 115 passes through a termination connector 121, a termination connector 124, an expansion connector 127, and a termination connector 130 as previously described.

To assist in isolation of any faults occurring in the interconnection of the connectors having dedicated test line 115 passing therethrough, test contacts are provided which are in communication with dedicated test line 115 within selected connectors. Thus, a test contact 123 is provided in termination connector 121 and is in communication with the termination conductor such that test contact 123 will make available any signal on dedicated test line 115 at that location. Likewise, a test contact 126 is provided in termination connector 124, a test contact 128 is provided in expansion connector 127, and a test contact 132 is provided in termination connector 130. When dedicated test line 115 is energized at test point 116, a voltage may be sensed at test point 123 by means of a voltage probe, for example, as long as expansion connector 120 and termination connector 121 are properly interconnected. A voltage probe can be used to sequentially verify the proper interconnection of the remaining connectors by monitoring the corresponding test contacts.

Termination device 122 and the device end of termination connector 121 are shown in greater detail in FIG. 8. Termination conductor 111 feeds between terminals 112 and 113 corresponding to the dedicated test line. Termination conductor 111 also extends to test contact 123 on the outer surface of termination connector 121.

The fault isolation and detection provided by the present invention can be enhanced by employing a type of connector known as the last-make first-break connector as shown in FIG. 9. Thus, an expansion connector 130 includes a first end 131 and a second end 132. The dedicated test line includes a harness conductor 133 and a terminal pin 134. Devices lines 135 are connected to terminal pins 136. In second connector end 132, terminal socket 137 is connected to harness conductor 138 as the continuation of the dedicated test line. Terminal sockets 140 are connected to device conductors 141. In this embodiment, pin 134 is reduced in length compared to pins 136 and socket 137 is reduced in length compared to sockets 140 such that pin 134 and socket 137 are the last to make contact during interconnection of connector 130 and are the first to break contact during disconnection of connector 130. Since the regular device connection terminals must become more completely interconnected before sufficient connection is made to complete the dedicated test line, whenever the dedicated test line is properly interconnected the remaining terminal connections are more certain to be fully interconnected. Thus, the present invention provides a reliable indication of the proper interconnection of critical devices. In addition, the failure of the dedicated test line connection will indicate a partial interconnection failure, such as a failure to securely lock the connector together, even without an electrical failure of the regular device terminals.

FIG. 10 shows a termination connector having last-make first-break test line terminals. A first connector end 146 has one test line harness conductor 150 connected to a last-make first-break terminal pin 151 and a test line harness conductor 152 connected to a last-make first-break terminal pin 153. Device lines 154 are connected to device terminals pins 155 which extend longer than terminal pins 151 and 153.

A second connector end 147 includes last-make first-break terminal sockets 156 and 157 interconnected by a terminal conductor 158 for feeding through the dedicated test line. Device line terminal sockets 159 extend longer than terminal sockets 156 and 157.

Figure 11:
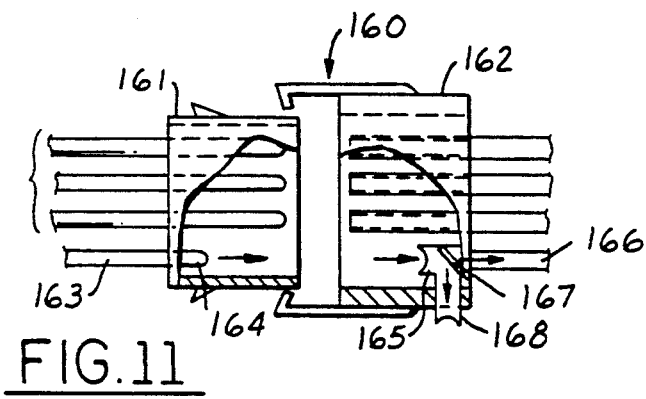
FIG. 11 is a cross-sectional view of an expansion connector including an optical dedicated test line and a test terminal for receiving a partial optical signal.

An alternative embodiment of the invention, shown in FIG. 11, includes a dedicated test line for carrying an optical signal. Thus, an expansion connector 160 includes a first end 161. The dedicated test line includes harness conductor 163 which is comprised of an optical fiber which is in contact with an optical conductor portion 164 in a last-make first-break configuration. A second connector portion 162 includes an optical connector portion 165 for interfacing with optical connector portion 164 and transmitting light therefrom to an optical fiber 166 providing the continuation of the dedicated test line. A test contact 168 is also included in conjunction with a beam-splitter 167 for directing a portion of the light signal passing through the dedicated test line to test contact 168 to be used according to the embodiment of FIG. 7.

Figure 12:
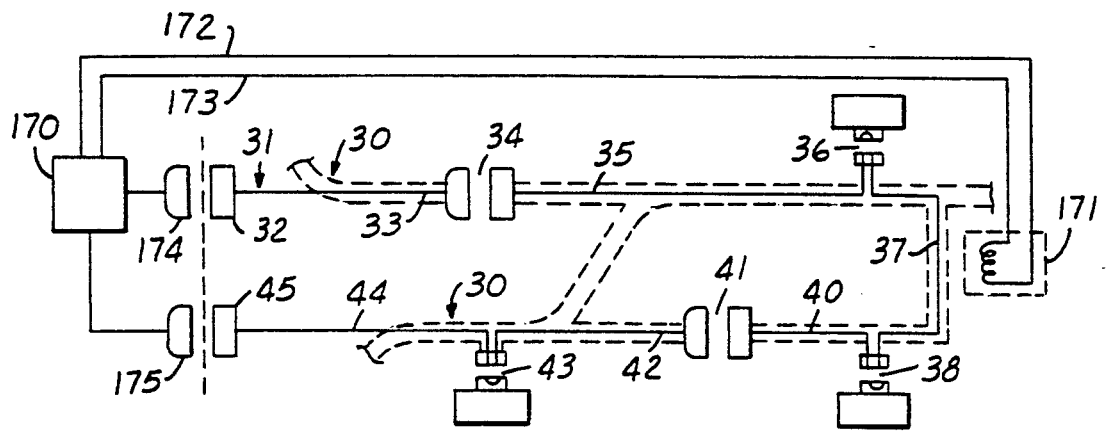
FIG. 12 is a diagram showing an alternative fault detection and isolation technique including a dedicated test line and an inductive pickup.

FIG. 12 illustrates a further embodiment of the present invention for isolating and detecting faults in the dedicated test line of the present invention. The vehicle wiring harness and dedicated test line are identical to that shown in FIG. 2. However, in this embodiment the test apparatus includes a control circuit 170 connected to first test point 32 by a connector 174 and to second test point 45 through a connector 175. The test apparatus further includes an inductive pickup probe 171 connected to control circuit 170 by lines 172 and 173. Control circuit 170 is adapted to produce a time varying test signal which is applied to dedicated test line 31 through connectors 174 and 175. Inductive pickup probe 171 is manually traced along dedicated test line 31 and the inductively received signal from the probe is used to generate an indication of the presence of the time varying signal in the dedicated test line. Such indication is then displayed by control circuit 170. As probe 171 is manually traced along dedicated test line 31, any interruption in the resulting measured signal indicates a wiring or connector fault at that point. Thus, the testing of proper interconnection of the critical electrical system components can be performed without additional mechanical contact to the dedicated test line.

While preferred embodiments of the invention have been shown and described herein, it will be understood that such embodiments are provided by way of example only. Numerous variations, changes, and substitutions will occur to those skilled in the art without departing from the spirit of the invention. Accordingly, it is intended that the appended claims cover all such variations as fall within the spirit and scope of the invention.

What is claimed is:

1. An automotive electrical system comprising:

a plurality of electrical devices including at least one termination device; and a wiring harness system interconnecting said electrical devices and including a plurality of harness conductors interconnected by a plurality of connectors, one of said connectors being a termination connector connected to said termination device;

said wiring harness system including a dedicated test line comprising a termination conductor disposed in said termination connector and comprising more than one of said harness conductors, said dedicated test line providing a separate continuous path when said termination connector is properly interconnected;

said dedicated test line further comprising at least one test point for testing the interconnection of said termination conductor.

2. The electrical system of claim 1 wherein said dedicated test line includes a pair of test points having said termination conductor electrically in series therebetween.

3. The electrical system of claim 2 wherein said termination conductor extends to one of said test points, said test point being located on the exterior surface of said termination connector.

4. The electrical system of claim 2 wherein one test point of said pair of test points provides an origination for said dedicated test line.

5. The electrical system of claim 1 wherein said dedicated test line is comprised of electrical harness conductors.

6. The electrical system of claim 5 wherein said dedicated test line includes terminal contacts within said termination connector, said terminal contacts being the last of all contacts in said termination connector to make contact during interconnection of said termination connector and being the first of all said contacts to break contact during disconnection of said termination connector.

7. The electrical system of claim 6 wherein said termination connector is locked together when said last-to-make and first-to-break contacts are in contact.

8. The electrical system of claim 1 wherein said dedicated test line is comprised of optical harness conductors.

9. The electrical system of claim 1 wherein said termination connector has a harness end and a device end, said termination conductor being integral with said device end and connected in series with a pair of said harness conductors via said harness end of said termination connector.

10. The electrical system of claim 1 wherein said plurality of connectors further include at least one expansion connector having said dedicated test line passing therethrough.

11. The electrical system of claim 10 wherein said dedicated test line includes terminal contacts within said expansion connector, said terminal contacts being the last of all contacts in said expansion connector to make contact during interconnection of said expansion connector and being the first of all said contacts to break contact during disconnection of said expansion connector.

12. The electrical system of claim 11 wherein said expansion connector is locked together when said last-to-make and first-to-break contacts are in contact.

13. The electrical system of claim 1 wherein said plurality of connectors further include at least one junction block having said dedicated test line passing therethrough.

14. The electrical system of claim 1 including a plurality of termination connectors, each termination connector having a harness end and a device end and each termination connector having a test point located on the exterior surface of its device end.

15. A method for testing the interconnection of an automotive electrical system comprising the steps of:
providing a plurality of electrical components including at least one termination device;
interconnecting said electrical components using a wiring harness system including a plurality of harness conductors interconnected by a plurality of connectors, one of said connectors being a termination connector connected to said termination device;
providing a dedicated test line in said wiring harness system comprising a termination conductor disposed in said termination connector and comprising more than one of said harness conductors, said dedicated test line providing a separate continuous path when said termination connector is properly interconnected;
providing a pair of test points in said dedicated test line, said test points having said termination conductor in series therebetween;
injecting a test signal at one of said test points; and
monitoring the other of said test points to receive said test signal as an indication of proper interconnection of at least a portion of said electrical system.

16. The method of claim 15 wherein said dedicated test line follows a path including a plurality of critical components in said electrical system.

17. The method of claim 15 wherein said monitoring step determines electrical continuity between said test points.

18. The method of claim 15 wherein said monitoring step determines optical transmissivity between said test points.

19. A method for testing the interconnection of an automotive electrical system comprising the steps of:
providing a plurality of electrical components including at least one termination device;
interconnecting said electrical components using a wiring harness system including a plurality of harness conductors interconnected by a plurality of connectors, one of said connectors being a termination connector connected to said termination device;
providing a dedicated test line in said wiring harness system comprising a termination conductor disposed in said termination connector and comprising more than one of said harness conductors;
providing a pair of test points in said dedicated test line, said test points having said termination conductor in series therebetween;
injecting a time-varying test signal across said test points;
tracing said dedicated test line with an inductive pickup to sense said time-varying signal; and
indicating a fault in said electrical system at a location of said test line where said time-varying signal is not sensed by said inductive pickup.

* * * * *